United States Patent
Hayakawa et al.

(10) Patent No.: US 9,653,883 B2
(45) Date of Patent: May 16, 2017

(54) SURFACE EMITTING SEMICONDUCTOR LASER DEVICE

(71) Applicant: FUJI XEROX CO., LTD., Tokyo (JP)

(72) Inventors: Junichiro Hayakawa, Ebina (JP); Akemi Murakami, Ebina (JP); Takashi Kondo, Ebina (JP); Kazutaka Takeda, Ebina (JP); Naoki Jogan, Ebina (JP); Jun Sakurai, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/066,252

(22) Filed: Mar. 10, 2016

(65) Prior Publication Data

US 2016/0276808 A1    Sep. 22, 2016

(30) Foreign Application Priority Data

Mar. 19, 2015 (JP) ................. 2015-056254

(51) Int. Cl.
  *H01S 5/30* (2006.01)
  *H01S 5/024* (2006.01)
  *H01S 5/183* (2006.01)
  *H01S 5/343* (2006.01)

(52) U.S. Cl.
  CPC ........ *H01S 5/3054* (2013.01); *H01S 5/02461* (2013.01); *H01S 5/18361* (2013.01); *H01S 5/18358* (2013.01); *H01S 5/18383* (2013.01); *H01S 5/3432* (2013.01); *H01S 5/34353* (2013.01)

(58) Field of Classification Search
  None
  See application file for complete search history.

(56) References Cited

U.S. PATENT DOCUMENTS

| | | | |
|---|---|---|---|
| 6,720,585 B1 | 4/2004 | Wasserbauer et al. | |
| 2008/0049329 A1 | 2/2008 | Takeuchi | |
| 2008/0056321 A1* | 3/2008 | Motomura | B41J 2/45 372/45.01 |
| 2011/0026555 A1 | 2/2011 | Takeuchi | |

FOREIGN PATENT DOCUMENTS

| | | |
|---|---|---|
| JP | 2008-060322 A | 3/2008 |
| JP | 4300245 B2 | 7/2009 |
| JP | 2011-035115 A | 2/2011 |
| WO | 2007/063806 A1 | 6/2007 |

OTHER PUBLICATIONS

Mar. 1, 2016 Office Action issued in Japanese Patent Application No. 2015-056254.

* cited by examiner

*Primary Examiner* — Armando Rodriguez
(74) *Attorney, Agent, or Firm* — Oliff PLC

(57) ABSTRACT

There is provided a surface emitting semiconductor laser including: a substrate; and a semiconductor layer including: a first semiconductor multilayer film having plural sets of specific layers, a second semiconductor multilayer film having plural sets of specific layers, and an active layer provided between them, so as to constitute a resonator.

8 Claims, 9 Drawing Sheets

Fig. 4

| Sample name | Film thickness of composition inclination layer (nm) | Positions of antinodes and nodes of light intensity distribution |
|---|---|---|
| Example 1 | 10 | Interface between composition inclination layer and high thermal conductivity layer |
| Example 2 | 15 | Interface between composition inclination layer and high thermal conductivity layer |
| Example 3 | 18 | Interface between composition inclination layer and high thermal conductivity layer |
| Example 4 | 20 | Interface between composition inclination layer and high thermal conductivity layer |
| Example 5 | 25 | Interface between composition inclination layer and high thermal conductivity layer |
| Comparative Example 1 | 20 | Center of composition inclination layer |
| Comparative Example 2 | 10 | Center of composition inclination layer |
| Comparative Example 3 | 10 | Inside of high thermal conductivity layer |

SURFACE EMITTING SEMICONDUCTOR LASER DEVICE

CROSS-REFERENCE TO RELATED APPLICATION(S)

This application is based on and claims priority under 35 U.S.C. 119 from Japanese Patent Application Nos. 2015-056254 filed on Mar. 19, 2015.

BACKGROUND

Technical Field

The present invention relates to a surface emitting semiconductor laser device.

SUMMARY

According to an exemplary embodiment of the present invention, there is provided a surface emitting semiconductor laser including:

a substrate; and
a semiconductor layer including:
a first semiconductor multilayer film including a plurality of first sets, each set being formed of two layers different from each other in refractive index and thermal conductivity; and
a second semiconductor multilayer film the second semiconductor multilayer including a plurality of second sets, each set being formed of two layers different from each other in refractive index and thermal conductivity; and
an active layer provided between the first semiconductor multilayer film and the second semiconductor multilayer film,
wherein the first semiconductor multilayer film, the second semiconductor multilayer film, and the active layer constitutes a resonator,
at least one set in the plurality of first sets and the plurality of second sets is composed of a first layer having a first thermal conductivity, a first composition inclination layer, a second layer having a second thermal conductivity lower than the first thermal conductivity and a second composition inclination layer, and
an optical film thickness of the first layer is $(2m+1)\lambda/4$, wherein $\lambda$ is an oscillation wavelength of the resonator and m is an integer, and a total optical film thickness of the first composition inclination layer, the second layer and the second composition inclination layer is $(2n+1)\lambda/4$, wherein $\lambda$ is the oscillation wavelength of the resonator and n is an integer equal to or less than m.

BRIEF DESCRIPTION OF THE DRAWINGS

Exemplary embodiments of the present invention will be described in detail based on the following figures, wherein:

FIG. 4 is a view showing a list of samples of the surface emitting semiconductor laser device according to the embodiment and samples of the surface emitting semiconductor laser device according to comparative examples;

DETAILED DESCRIPTION

Figure 1:
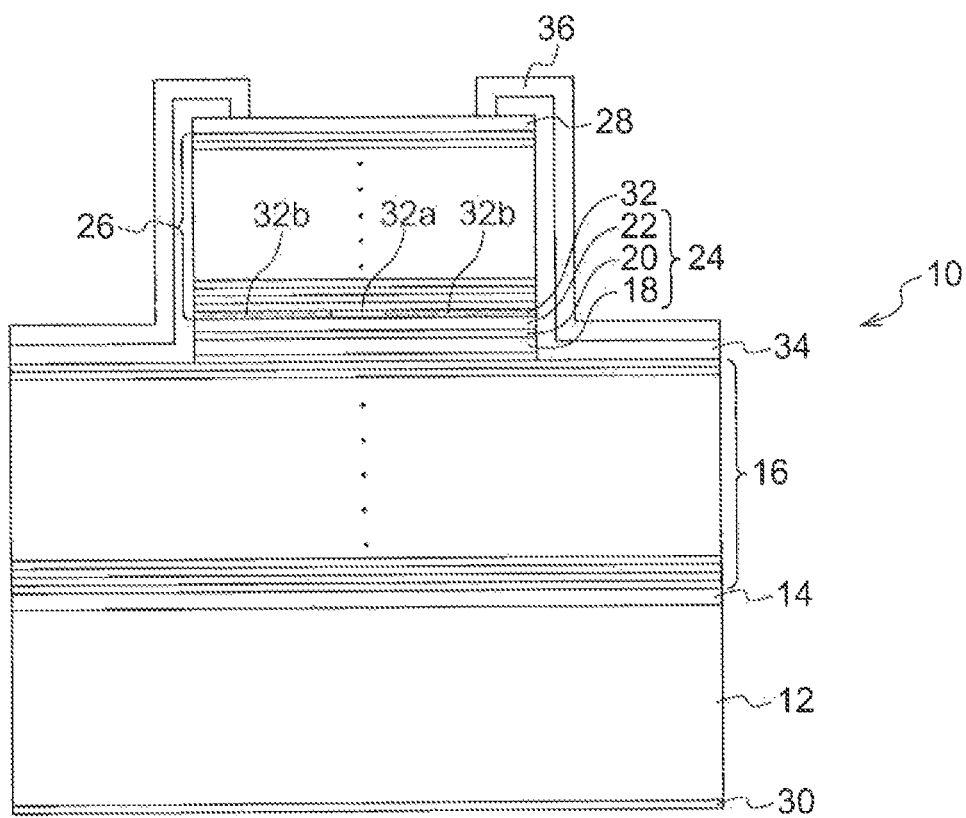
FIG. 1 is a vertical cross-sectional view showing a configuration example of a surface emitting semiconductor laser device according to an embodiment.

At least one embodiment of the present invention will be described below in detail referring to the accompanying drawings. First, a configuration example of a surface emitting semiconductor laser device 10 according to an embodiment of the invention will be described first. FIG. 1 is a vertical cross-sectional view showing the surface emitting semiconductor laser device 10 according to the embodiment. In the embodiment, a GaAs-based surface emitting semiconductor laser device using an n-type GaAs substrate is taken as an example and described. However, without being limited to this, it may be possible to use modes that are applied to surface emitting semiconductor laser devices in which InGaAsP-based, AlGaInP-based, InGaN/GaN-based materials, or the like, are used. Furthermore, the substrate of the semiconductor laser device is not limited to an n-type, and a p-type may also be used. In such a case, the n-type and the p-type may merely be replaced reversely with each other in the following descriptions.

As shown in FIG. 1, the surface emitting semiconductor laser device 10 is composed of a buffer layer 14 formed on a substrate 12, a lower DBR (Distributed Bragg Reflector) 16, an active region 24, an AlAs layer 32, an upper DBR 26 and a contact layer 28.

An insulating film 34 serving as an inorganic insulating film made of a silicon oxynitride film, for example, is deposited around a semiconductor layer including a mesa structure, and a P-type electrode 36 is provided via the insulating film 34. The P-type electrode 36 is connected to the contact layer 28 formed with p-type GaAs on the upper DBR 26, for example, thereby forming an ohmic contact with the contact layer 28. On the other hand, an n-type electrode 30 is provided on the face on the opposite side of the face of the substrate 12 on which the semiconductor layer is formed.

One example of the substrate 12 according to the embodiment is a GaAs substrate in which Si (silicon) is doped.

The buffer layer 14 formed on the substrate 12 is composed of, for example, an n-type GaAs in which Si is doped in a GaAs layer.

The n-type lower DBR 16 formed on the buffer layer 14 is a multilayer film reflector in which two semiconductor layers having a film thickness of $0.25\lambda/n$ in the case that the oscillation wavelength of the surface emitting semiconductor laser device 10 is $\lambda$ and that the refractive index of a medium (semiconductor layer) is n and having refractive indexes being different from each other are laminated alternately. More specifically, the lower DBR 16 is configured by alternately laminating an n-type low refractive index layer formed of $Al_xGa_{1-x}As$ in which Si is doped and an n-type high refractive index layer formed of $Al_yGa_{1-y}As$ (x>Y) in which Si is doped. In the case of the lower DBR 16 according to the embodiment, a composition inclination layer is provided between the high refractive index layer and the low refractive index layer. The details of the composition inclination layer will be described later.

The active region 24 according to the embodiment is composed of a lower spacer layer 18, a quantum well active layer 20 and an upper spacer layer 22. The quantum well active layer 20 according to the embodiment is composed of four barrier layers formed of $Al_zGa_{1-z}As$ and three quantum well layers formed of $Al_wGa_{1-w}As$ provided therebetween. The lower spacer layer 18 is disposed between the quantum well active layer 20 and the lower DBR 16 and the upper spacer layer 22 is disposed between the quantum well active layer 20 and the upper DBR 26, whereby the layers have a function of adjusting the length of a resonator and a function of serving as clad layers for confining carriers. The resonator according to the present invention is configured such that the interface between the lower DBR 16 and the lower spacer layer 18 serves as one end face and such that the interface between the upper DBR 26 and the upper spacer layer 22 serves as the other end face.

The p-type AlAs layer 32 provided on the active region 24 is a current constriction layer and is composed of a current injection region 32a and selective oxidation regions 32b. The current flowing from the p-type electrode 36 to the n-type electrode 30 is constricted by the current injection region 32a.

The upper DBR 26 formed on the AlAs layer 32 is a multilayer film reflector in which two semiconductor layers having a film thickness of $0.25\lambda/n$ and having refractive indexes being different from each other are laminated alternately. More specifically, the upper DBR 26 is configured by alternately laminating a p-type low refractive index layer formed of $Al_xGa_{1-x}As$ in which C (carbon) is doped and a p-type high refractive index layer formed of $Al_yGa_{1-y}As$ (x>Y) in which C is doped. Also in the upper DBR 26, a composition inclination layer is provided between the high refractive index layer and the low refractive index layer in some cases.

The above-mentioned surface emitting semiconductor laser device is characterized, for example, in that the laser output thereof is taken out in a direction perpendicular to the substrate and that a plurality of the laser devices are easily arrayed by two-dimensional integration, thereby being used as a writing light source for an electro-photographic system and a light source for optical communication.

The surface emitting semiconductor laser device is configured so as to be equipped with a pair of distributed Bragg reflectors (the lower DBR 16 and the upper DBR 26) provided on a semiconductor substrate (the substrate 12), an active layer (the quantum well active layer 20) provided between the pair of distributed Bragg reflectors, and resonator spacer layers (the lower spacer layer 18 and the upper spacer layer 22). Furthermore, the laser device is configured such that current is injected into the active layer via the electrodes (the p-type electrode 36 and the n-type electrode 30) provided on both sides of the distributed Bragg reflectors, such that laser oscillation is generated in a direction per to the face of the substrate, and such that laser light is emitted from the upper section (the face side of the contact layer 28) of the device. In the surface emitting semiconductor laser device configured as described above, the reflectivity of the DBR is basically raised to a high value to attain high light emission efficiency.

On the other hand, in the surface emitting semiconductor laser device, current flows through the DBR. Hence, if the value of the electric resistance of the whole DBR is large, the current injected into the surface emitting semiconductor laser device is converted into Joule heat at the DBR, whereby the light emission efficiency of the laser device becomes low eventually. Therefore, a composition inclination layer is provided at the interface of each layer of the DBR in some cases to lower the electric resistance of the DBR.

The composition inclination layer is a layer in which the composition of one of two kinds of semiconductor layers is changed gradually to the composition of the other semiconductor layer. The generation of a potential barrier on the hetero interface thereof is suppressed by providing the composition inclination layer. In other words, the composition inclination layer is a layer having an intermediate composition between the compositions of the two kinds of semiconductor layers. When the DBR of the surface emitting semiconductor laser device according to the embodiment is taken as an example, the composition inclination layer is a layer in which the composition is changed gradually from the low refractive index layer formed of $Al_xGa_{1-x}As$ to the high refractive index layer formed of $Al_yGa_{1-y}As$. The change in the composition of Al (aluminum) is taken as an example of the change in composition. Although it is generally preferable that the composition inclination layer should be applied to both the lower DBR 16 and the upper DBR 26, even if the composition inclination layer is applied to one of them, a certain effect is obtained.

On the other hand, the suppression of the temperature rise around the active layer is required to be considered to obtain high reliability and a satisfactory temperature characteristic in the surface emitting semiconductor laser device. In the case that the DBR is composed of a layer having a relatively high thermal conductivity (a high thermal conductivity layer) and a layer having a relatively low thermal conductivity (a low thermal conductivity layer), a method of lowering the thermal resistance of the whole DBR by increasing the film thickness of the high thermal conductivity layer is taken as a method of suppressing the temperature rise. More specifically, the method is used to make the film thickness of the high thermal conductivity layer larger than λ/4 and to make the film thickness of the low thermal conductivity layer smaller than λ/4, and to set the total of the film thickness of the high thermal conductivity layer and the film thickness of the low thermal conductivity layer to λ/2 to prevent decrease in reflectivity.

As described above, in the DBR constituting the surface emitting semiconductor laser device, the electric resistance thereof is required to be decreased and the heat radiation thereof is required to be improved while the lowering of the reflectivity thereof is suppressed. However, both the introduction of the composition inclination layer for decreasing the electric resistance and the adjustment of the film thickness of the composition inclination layer for improving heat radiation are factors for lowering the reflectivity. Hence, it is difficult to attain both the decrease in electric resistance and the improvement in heat radiation while the reflectivity is maintained.

Therefore, in the embodiment, on the assumption that the electric resistance is decreased by providing the composition inclination layer, the optical film thickness of the layer on the side of the high thermal conductivity is set to an odd multiple of λ/4, and the total of the film thickness of the layer on the side of the low thermal conductivity and the film thicknesses of the composition inclination layers on both sides is set to an odd multiple of λ/4. With this configuration of the DBR, all the suppression of the lowering of the reflectivity, the decrease of the resistance of the device and the improvement of the heat radiation are attained.

Figure 9:
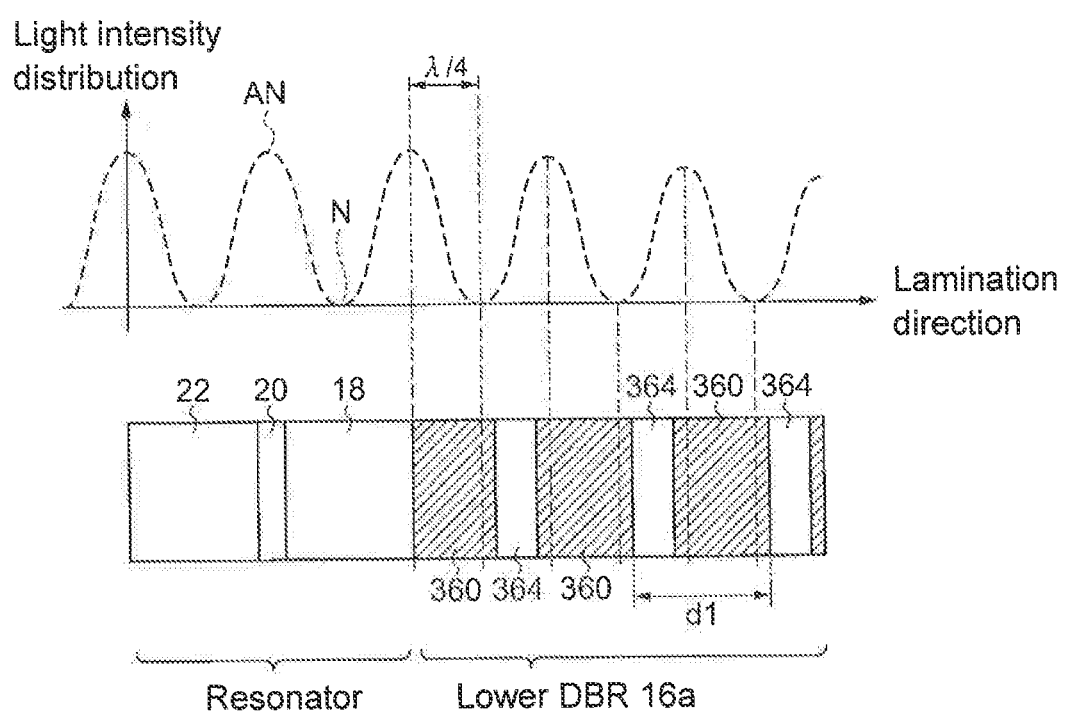
FIG. 9 is a view showing the relationship between the layer configuration and the light intensity distribution of the DBR of the surface emitting semiconductor laser device according to the conventional technology.

Next, before the layer configuration of the lower DBR 16 according to the embodiment is described referring to FIGS. 2A and 2B, the configuration of the DBR according to the conventional technology having no composition inclination layer will be described referring to FIG. 9 so that the configuration of the DBR according to the embodiment can be understood. FIG. 9 is a view showing the relationship between the layer configuration and the light intensity distribution (distribution obtained by squaring electric field distribution) of the DBR according to the conventional technology.

FIG. 9 shows the layer configuration of a lower DBR 16a according to the conventional technology together with a resonator composed of an upper spacer layer 22, a quantum well active layer 20 and a lower spacer layer 18. As shown in FIG. 9, the lower DBR 16a according to the conventional technology is formed such that the range including a high thermal conductivity layer 360 and a low thermal conductivity layer 364 is used as a single cycle, and this cycle is repeated. Furthermore, the film thickness of the high thermal conductivity layer 360 is made larger than λ/4, the film thickness of the low thermal conductivity layer 364 is made smaller than λ/4, and the film thickness dl of the single cycle of the high thermal conductivity layer 360 and the low thermal conductivity layer 364 is set to λ/2. With the above-mentioned configuration, the antinodes AN and the nodes N of the light intensity distribution (standing wave) in the lower DBR 16a according to the conventional technology are positioned in the inside of the high thermal conductivity layer 360 as shown in FIG. 9. In other words, the antinodes AN and the nodes N of the light intensity distribution are not positioned at the interface between the high thermal conductivity layer 360 and the low thermal conductivity layer 364.

As described above, in the lower DBR 16a according to the conventional technology, the antinodes AN and the nodes N of the light intensity distribution are not positioned at the interface between the high thermal conductivity layer and the low thermal conductivity layer. Hence, even if the lower DBR 16a according to the conventional technology has a certain effect for the decrease of thermal resistance, the reflectivity of the lower DBR 16a lowers.

Next, the relationship between the layer configuration and the light intensity distribution of the lower DBR 16 according to the embodiment will be described referring to FIGS. 2A and 2B. A mode in which the DBR according to the embodiment is applied to the lower DBR 16 is taken as an example and described below.

Figure 2A:
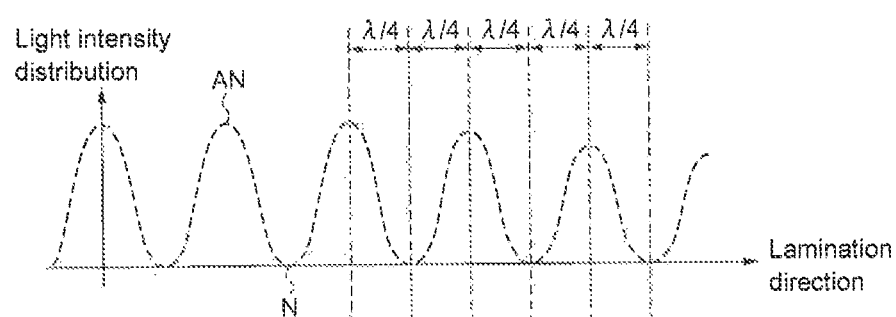
FIGS. 2A and 2B are views showing the relationship between the layer configuration and the light intensity distribution of the DBR of the surface emitting semiconductor laser device according to the embodiment.
Figure 2B:
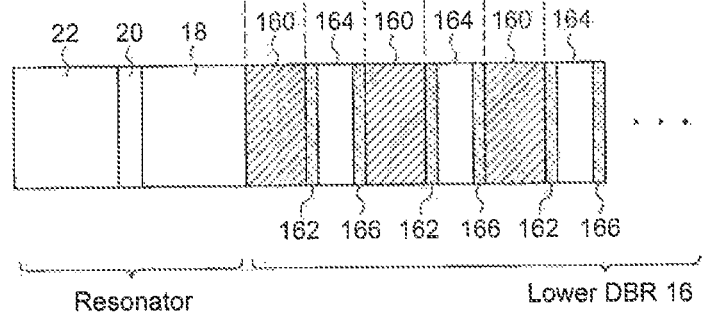

FIG. 2B shows the layer configuration of the lower DBR 16 together with a resonator composed of the upper spacer layer 22, the quantum well active layer 20 and the lower spacer layer 18. As shown in FIG. 2B, the lower DBR 16 according to the embodiment is formed such that the range including a high thermal conductivity layer 160, a low thermal conductivity layer 164 and composition inclination layers 162 and 166 disposed on both sides of the low thermal conductivity layer 164 is used as a single cycle, and this cycle is disposed repeatedly. Furthermore, the film thickness of the high thermal conductivity layer 160 is set to λ/4, and the total of the film thicknesses of the low thermal conductivity layer 164, the composition inclination layer 162 and the composition inclination layer 166 is set to λ/4. Moreover, the film thickness of the single cycle composed of the high thermal conductivity layer 160, the low thermal conductivity layer 164, the composition inclination layer 162 and the composition inclination layer 166 is set to λ/2.

One of the high thermal conductivity layer 160 and the low thermal conductivity layer 164 corresponds to the high refractive index layer of the DBR, and the other corresponds to the low refractive index layer. Either combination may be used for the correspondence between thermal conductivity and refractive index. In the embodiment, the low refractive index layer is formed of an $Al_xGa_{1-x}As$ layer and the high refractive index layer is formed of an $Al_yGa_{1-y}As$ (x>Y) layer. Hence, for example, in the case of x=0.9 and y=0.3, the high thermal conductivity layer 160 corresponds to an $Al_{0.9}Ga_{0.1}As$ layer serving as a low refractive index layer, and the low thermal conductivity layer 164 corresponds to an $Al_{0.3}Ga_{0.7}As$ layer serving as a low refractive index layer. In other words, the thermal conductivity changes depending on the composition of Al.

What's more, in the embodiment, the mode in which the film thickness of the high thermal conductivity layer 160 is set to λ/4 and the total of the film thicknesses of the low thermal conductivity layer 164, the composition inclination layer 162 and the composition inclination layer 166 is set to λ/4 is taken as an example and described. However, the embodiment is not limited to this mode. It may be possible that the film thickness of the high thermal conductivity layer 160 is set to (2m+1)λ/4 (m is an integer) and the total of the film thicknesses of the low thermal conductivity layer 164, the composition inclination layer 162 and the composition inclination layer 166 is set to (2n+1)λ/4 (n is an integer, n≤m). In this case, the film thickness of the single cycle composed of the high thermal conductivity layer 160, the low thermal conductivity layer 164, the composition inclination layer 162 and the composition inclination layer 166 is set to (m+n+1)λ/2, that is, an integral multiple of λ/2.

Furthermore, at least one set of the single cycle composed of the high thermal conductivity layer 160, the low thermal conductivity layer 164, the composition inclination layer 162 and the composition inclination layer 166 is included in the lower DBR 16, the effect according to the embodiment is obtained. However, in the embodiment, the respective film thicknesses of the high thermal conductivity layer 160, the low thermal conductivity layer 164 and the composition inclination layers 162 and 166 are not limited to the above-mentioned film thicknesses but include ranges being allowable due to dispersion in film thickness (for example, approximately ±1.5%) during production from design values.

FIG. 2A shows the light intensity distribution, i.e., standing wave, corresponding to the layer configuration of the resonator and the lower DBR 16 shown in FIG. 2B. As shown in FIG. 2A, in the embodiment, the antinodes AN of the light intensity distribution are positioned at both ends of the resonator and at the quantum well active layer 20. Furthermore, the antinodes AN or the nodes N of the light intensity distribution are positioned at the interface between the high thermal conductivity layer 160 and the composition inclination layer 162 and at the interface between the high thermal conductivity layer 160 and the composition inclination layer 166. Moreover, the antinodes AN or the nodes N of the light intensity distribution are not positioned either at the interface between the low thermal conductivity layer 164 and the composition inclination layer 162 or at the interface between the low thermal conductivity layer 164 and the composition inclination layer 166.

Figures 3A, 3B, 3C:
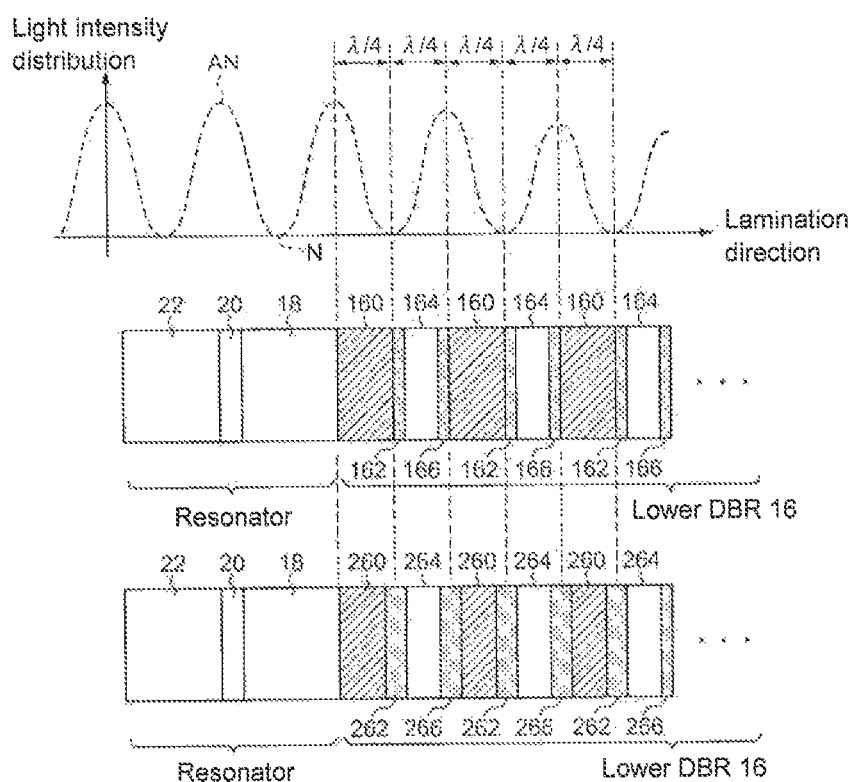
FIGS. 3A to 3C are views showing the relationship between the layer configuration and the light intensity distribution of the DBR of the surface emitting semiconductor laser device according to the embodiment and also showing the relationship between the layer configuration and the light intensity distribution of the DBR of the surface emitting semiconductor laser device according to a comparative example for comparison.

Next, the lower DBR 16 according to the embodiment will be described referring to FIGS. 3A to 3C in comparison with a lower DBR 16b according to a comparative example in which composition inclination layers are introduced into the lower DBR 16a according to the above-mentioned conventional technology. FIGS. 3A and 3B are views showing again the layer configuration and the light intensity distribution of the lower DBR 16 according to the embodiment shown in FIGS. 2A and 2B, and FIG. 3C is a view showing the layer configuration of the lower DBR 16b according to the comparative example.

As shown in FIG. 3C, the lower DBR 16b according to the comparative example is formed such that the range including a high thermal conductivity layer 260, a low thermal conductivity layer 264 and composition inclination layers 262 and 266 is used as a single cycle, and this cycle is repeated. Furthermore, the total of the film thicknesses of the high thermal conductivity layer 260 and portions of the composition inclination layers 262 and 266 is set to $\lambda/4$, and the total of the film thicknesses of the low thermal conductivity layer 264 and portions of the composition inclination layers 262 and 266 is set to $\lambda/4$. Also in the lower DBR 16b, the total film thickness of the single cycle including the high thermal conductivity layer 260, the low thermal conductivity layer 264 and the composition inclination layers 262 and 266 is set to $\lambda/2$. In the case that a composition inclination layer is introduced between the high thermal conductivity layer 360 and the low thermal conductivity layer 364 of the lower DBR 16a shown in FIG. 9, the lower DBR 16b having the layer configuration shown in FIG. 3(c) is obtained.

As being made clear by referring to FIGS. 3A and 3C, even when the composition inclination layers are simply introduced into the lower DBR 16a according to the conventional technology, the antinodes AN and the nodes N of the light intensity distribution are positioned in the insides of the composition inclination layers 262 and 266 or in the inside of the high thermal conductivity layer 260. In other words, the antinode AN and the node N of the light intensity distribution are not positioned either at the interface between the high thermal conductivity layer 260 and each of the composition inclination layers 262 and 266 or at the interface between the low thermal conductivity layer 264 and each of the composition inclination layers 262 and 266.

Next, the characteristics of the lower DBR 16 according to the embodiment will be described referring to FIGS. 4 to 7. FIGS. 4 to 7 show simulation results of various characteristics in the case that the surface emitting semiconductor laser device 10 having the layer configuration shown in FIG. 1 and a surface emitting semiconductor laser device according to the comparative example in which the layer configuration of the lower DBR in the surface emitting semiconductor laser device 10 is formed so as to have the layer configuration shown in FIG. 3C are modeled by a three-dimensional model, and that a heat source having a predetermined calorific value is disposed at the active region 24.

Simulation conditions common to the surface emitting semiconductor laser devices (hereafter referred to as "samples") in the simulation are described below. In other words, in the simulation, the oscillation wavelength of the surface emitting semiconductor laser device is set to 780 nm. Furthermore, the configuration of the DBR according to the embodiment is adopted only in the lower DBR 16 and the DBR is provided with composition inclination layers, and the upper DBR 26 is not provided with composition inclination layers. In other words, in the simulation, the high thermal conductivity layer (low refractive index layer) of the lower DBR 16 is formed of an AlAs layer, and the low thermal conductivity layer (high refractive index layer) is formed of an $Al_{0.3}Ga_{0.7}As$ layer. On the other hand, in the upper DBR 26, the high thermal conductivity layer (low refractive index layer) is formed of an $Al_{0.9}Ga_{0.1}As$ layer, and the low thermal conductivity layer (high refractive index layer) is formed of an $Al_{0.3}Ga_{0.7}As$ layer.

FIG. 4 shows a list of simulation models subjected to the simulation in the embodiment. In the embodiment, five kinds of laser devices (described as sample names, Examples 1 to 5, in FIG. 4) are subjected to the simulation as the surface emitting semiconductor laser device 10 according to the embodiment, and three kinds of laser devices (described as sample names, Comparative Examples 1 to 3, in FIG. 4) are subjected to the simulation as the surface emitting semiconductor laser device 10 according to the comparative example.

Examples 1 to 5 are samples in which the film thickness of the composition inclination layer is changed in the surface emitting semiconductor laser device according to the embodiment. The film thickness is 10 nm in Example 1, 15 nm in Example 2, 18 nm in Example 3, 20 mm in Example 4, and 25 nm in Example 5. In each sample, the antinodes AN and the nodes N of the light intensity distribution are positioned at the interface between the high thermal conductivity layer 160 and the composition inclination layer 162 or at the interface between the high thermal conductivity layer 160 and the composition inclination layer 166.

On the other hand, in Comparative Examples 1 and 2, the antinodes AN and the nodes N of the light intensity distribution are each positioned at the center of the composition inclination layer. The film thickness of the composition inclination layer is set to 20 nm in Comparative Example 1, and the film thickness of the composition inclination layer is set to 10 nm in Comparative Example 2. In addition, in Comparative Example 3, the composition inclination layers are introduced into the lower DBR 16a (see FIG. 9) according to the conventional technology, wherein the antinodes AN and the nodes N of the light intensity distribution are each positioned in the inside of the high thermal conductivity layer 260, and the film thickness of the composition inclination layer is set to 10 nm. In the simulation, the film thickness of the composition inclination layer is the film thickness of each of the composition inclination layers 162 and 166 or 262 and 266.

Figure 5:
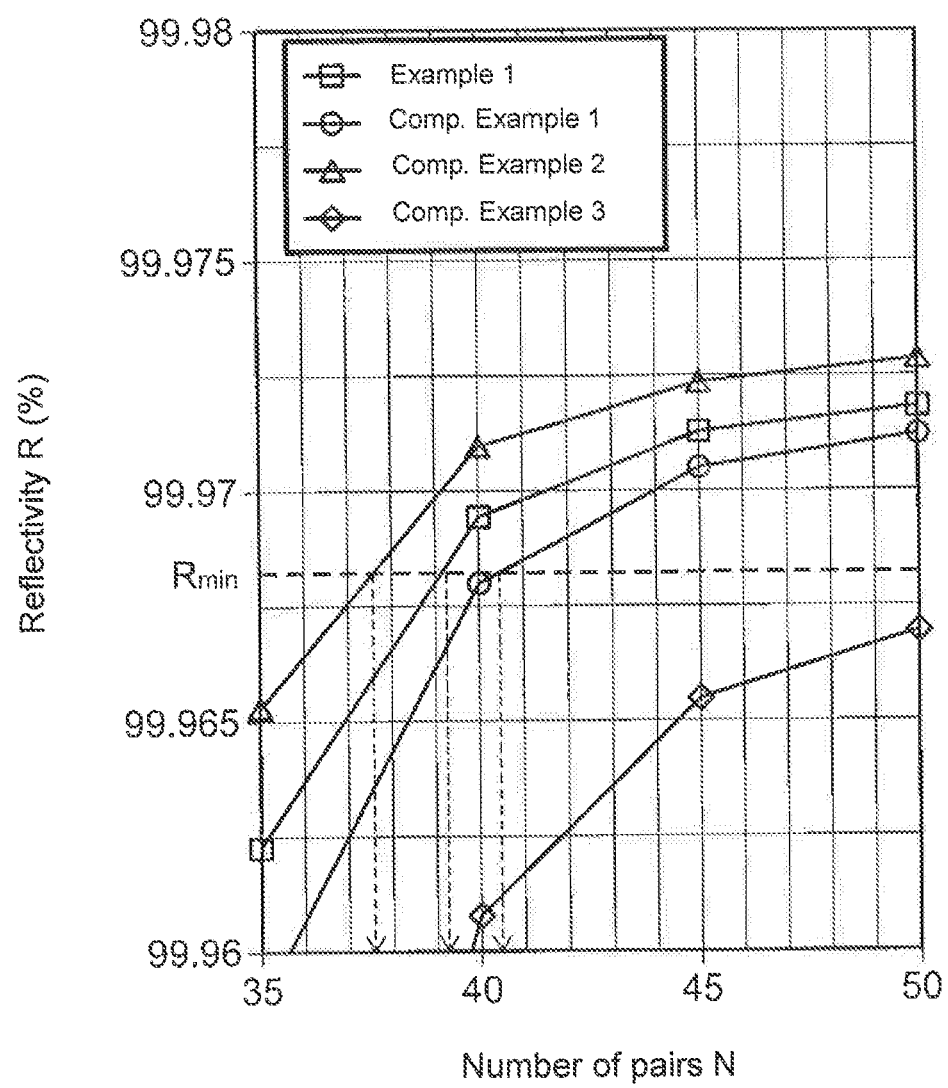
FIG. 5 is a view showing the relationship between the number of pairs of layers for the DBR and the reflectivity of the DBR in the surface emitting semiconductor laser device according to the embodiment and also showing the relationship in the surface emitting semiconductor laser device according to the comparative examples for comparison.

FIG. 5 shows the simulation results of the relationship between the number of pairs N for the lower DBR and the reflectivity R of the lower DBR in Example 1 and Comparative Examples 1 to 3. The number of pairs for the lower DBR is the number of laminations of the layers for the lower DBR, each layer formed of a single cycle composed of the high thermal conductivity layer, the composition inclination layers and the low thermal conductivity layer. In other words, in Examples 1 to 5, the number of pairs is the number of laminations of the layers, each layer formed of a single cycle composed of the high thermal conductivity layer 160, the composition inclination layer 162, the low thermal conductivity layer 164 and the composition inclination layer 166, and in Comparative Examples 1 to 3, the number of pairs is the number of laminations of the layers, each layer formed of a single cycle composed of the high thermal conductivity layer 260, the composition inclination layer 262, the low thermal conductivity layer 264 and the composition inclination layer 266. Furthermore, in the embodiment, the minimum reflectivity Rmin for obtaining normal laser oscillation in the surface emitting semiconductor laser device is set to Rmin=99.967%, for example.

As shown in FIG. 5, the number of pairs required to satisfy the condition of the reflectivity R≥Rmin in each sample is as described below. However, the values of pairs after the decimal point, other than 0.5, are meaningless and thus rounded in FIG. 5. The number of pairs is: N=39.5 in Example 1, N=40.5 in Comparative Example 1, and N=37.5 in Comparative Example 2.

In Comparative Example 3, the reflectivity R becomes small significantly. Even if the number of pairs is increased, the reflectivity R satisfying the condition of R≥Rmin is not obtained.

According to the results shown in FIG. 5, in the case that the values of the film thicknesses of the composition inclination layers are the same (10 nm), from the viewpoint of the reflectivity R, the target characteristic (reflectivity R≥Rmin) is obtained in both Example 1 and Comparative Example 2, and it is found that the number of pairs for the DBR in Comparative Example 2 is smaller than that in Example 1 by two pairs.

Figure 6A:
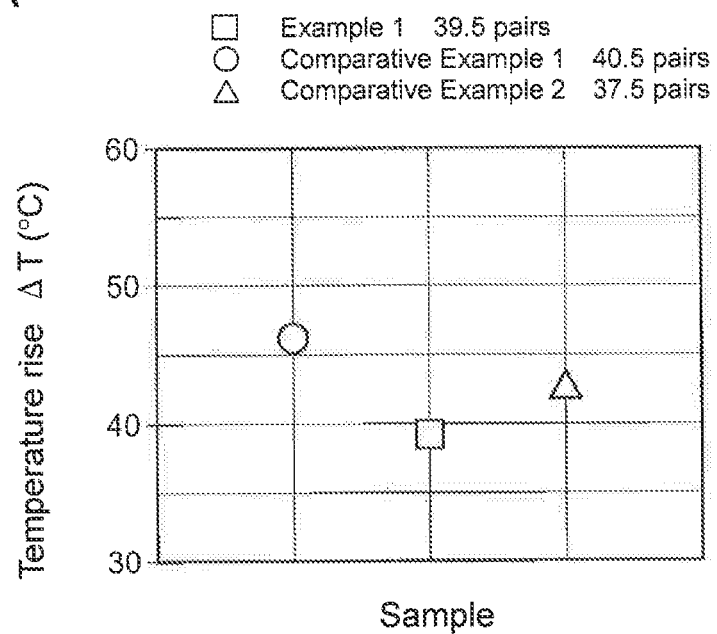
FIGS. 6A and 6B are views showing the temperature rise characteristic and the relationship between the calorific value and temperature rise in the surface emitting semiconductor laser device according to the embodiment and also showing the temperature rise characteristic and the relationship between the calorific value and temperature rise in the surface emitting semiconductor laser device according to the comparative examples for comparison.
Figure 6B:
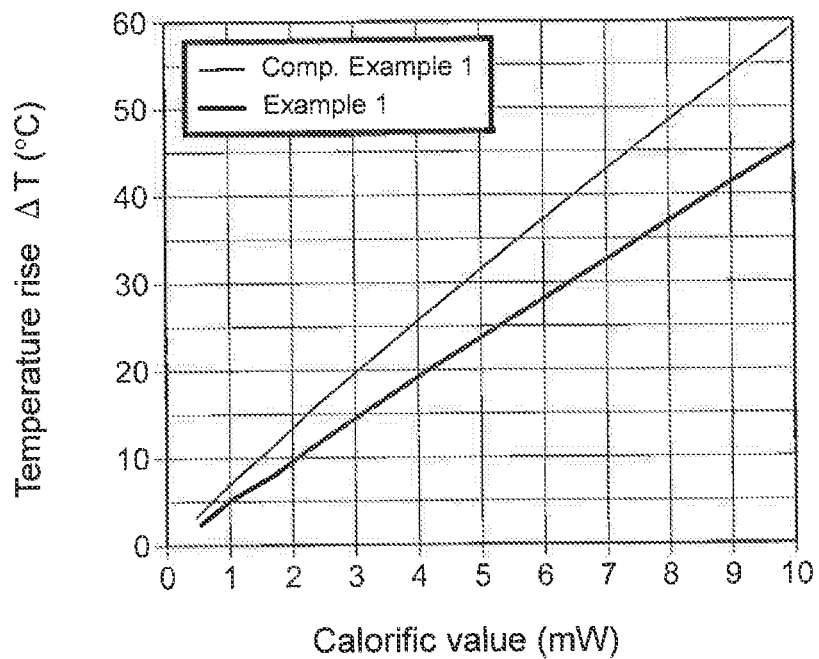

FIGS. 6A and 6B show the results of the comparison between Examples and Comparative Examples in terms of heat radiation. FIG. 6A shows the simulation results of temperature rise in Example 1, Comparative Example 1 and Comparative Example 2 having the number of pairs N wherein the reflectivity of the lower DBR becomes Rmin (=99.967). The "temperature rise ΔT" represented by the vertical axis of the graph of FIG. 6A indicates the difference between the room temperature and the temperature around the quantum well active layer 20 whose temperature has been raised from the room temperature (25° C.) by a heat source disposed in the active region 24 and having a predetermined calorific value. Comparative Example 3 is excluded from the targets of examination in the following descriptions according to the results of examination in FIG. 5.

Referring to FIG. 6A, the values of temperature rise ΔT in Example 1, Comparative Example 1 and Comparative Example 2 are as described below. The values are: ΔT=39° C. in Example 1, ΔT=46° C. in Comparative Example 1, and ΔT=42.5° C. in Comparative Example 2.

According to the results shown in FIG. 6A, in the case that the values of the reflectivity R of the lower DBRs are the same, it is found that the value of the temperature rise in Example 1 is the lowest. In particular, even in the case that Example 1 is compared with Comparative Example 2 having a smaller number of pairs N, the value of temperature rise ΔT in Example 1 is lower than that in Comparative Example 2 by 3 to 4° C. This is attributed to the fact that since the film thickness of the high thermal conductivity layer can be made larger, the heat radiation of the whole lower DBR can be enhanced further, although the number of pairs N in Example 1 is larger than that in Comparative Example 2.

FIG. 6B shows the relationship between the calorific value applied to the active region 24 and the value of temperature rise ΔT in Example 1 and Comparative Example 1. Although the temperature rises almost linearly with respect to the calorific value in both Example 1 and Comparative Example 1, the inclination of the temperature rise with respect to the calorific value in Example 1 is smaller than that in Comparative Example 1. In other words, it is found that the thermal resistance of the lower DBR in Example 1 is smaller than that of the lower DBR in Comparative Example 1.

Figure 7:
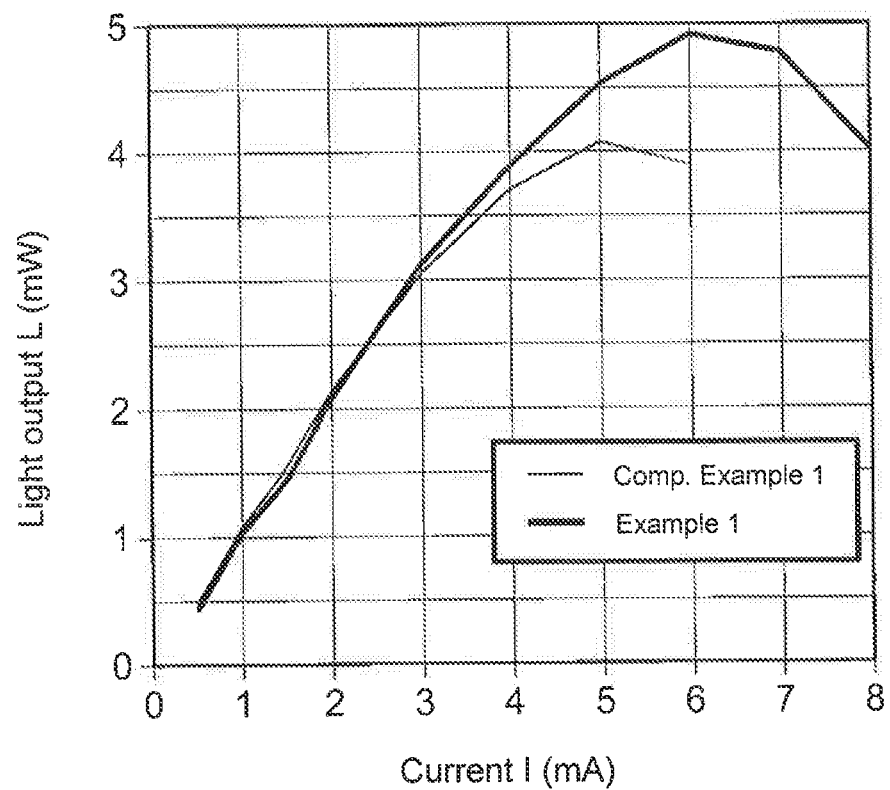
FIG. 7 is a view showing the I-L characteristic of the surface emitting semiconductor laser device according to the embodiment and also showing the I-L characteristic of the surface emitting semiconductor laser device according to the comparative example for comparison.

FIG. 7 shows the result of the comparison between Example 1 and Comparative Example 1 with respect to the relationship between the current I injected into the surface emitting semiconductor laser device and the light output L (the so-called "I-L" characteristic) of the laser device. Since both the thermal resistance and the electric resistance of the lower DBR in Example 1 are smaller than those in Comparative Example 1 as described above, the temperature rise is suppressed. Hence, it is found that although the maximum light output at the peak of the I-L characteristic is approximately 4 mW in Comparative Example 1, the maximum light output has increased to approximately 4.9 mW in Example 1.

Figure 8A:
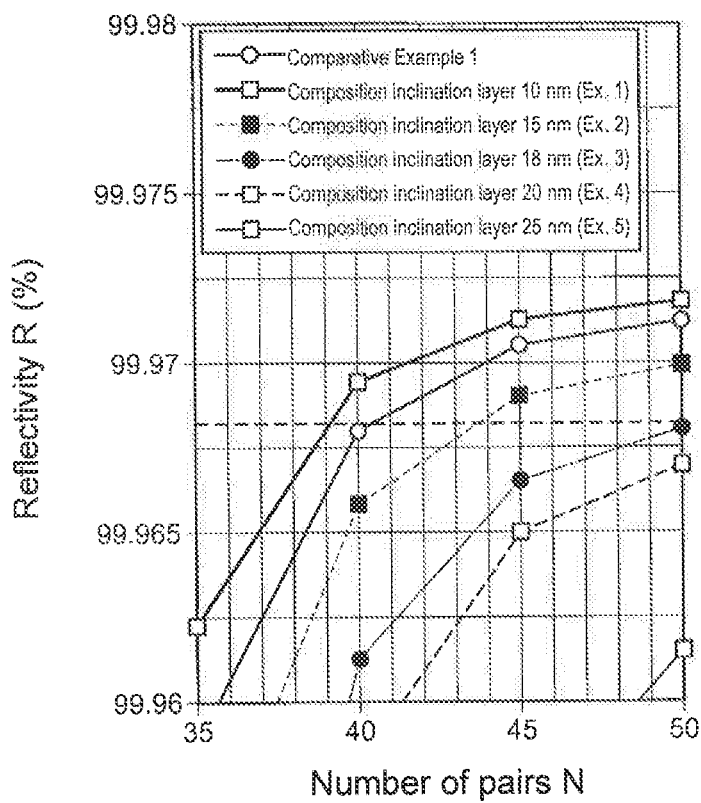
FIGS. 8A and 8B are views showing the relationship between the number of pairs of layers for the DBR and the reflectivity of the DBR and the temperature rise characteristic in the surface emitting semiconductor laser device according to the embodiment and also showing the relationship between the number of pairs of layers for the DBR and the reflectivity of the DBR and the temperature rise characteristic in the surface emitting semiconductor laser device according to the comparative example for comparison.
Figure 8B:
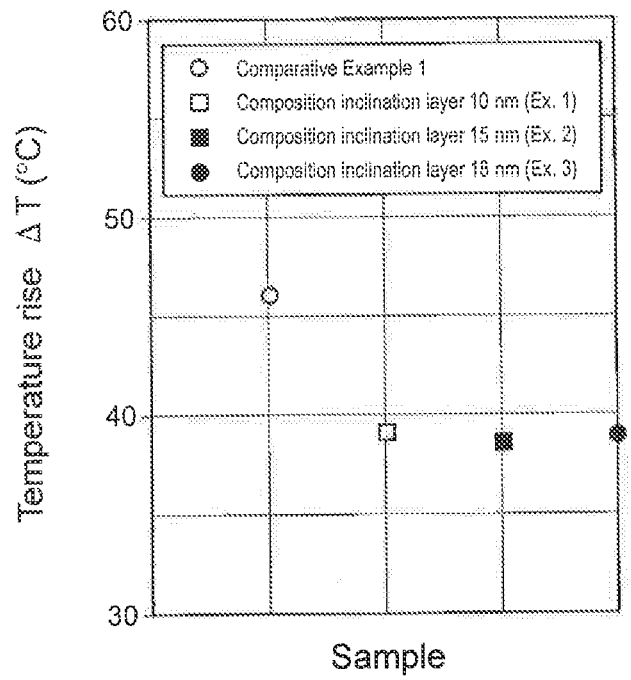

FIGS. 8A and 8B show the simulation results with respect to the influence of the film thicknesses of the composition inclination layers 162 and 166 in Examples 1 to 5. FIGS. 8A and 8B also show the simulation results in Comparative Example 1 for comparison. As shown in FIG. 4, the film thicknesses of the composition inclination layers in Examples are as follows: 10 nm in Example 1, 15 nm in Example 2, 18 nm in Example 3, 20 nm in Example 4, and 25 nm in Example 5.

FIG. 8A shows the simulation results of the reflectivity R in Examples 1 to 5 together with the simulation results of the reflectivity R in Comparative Example 1 (the reflectivity shown in FIG. 5 is shown here again). As shown in FIG. 8A, it is found that the condition of the reflectivity R≥Rmin is satisfied when the number of pairs N is 39.5 in Example 1, when the number of pairs N is 44 in Example 2, and when the number of pairs N is 50 in Example 3. In Examples 4 and 5, the condition of the reflectivity R≥Rmin is not satisfied when the number of pairs N is 50 or less.

According to the above-mentioned results, in the case that the film thickness of the composition inclination layer is 18 nm, the reflectivity R becomes the minimum value Rmin when the number of pairs N is approximately 50. In other words, in the case that the film thickness of the composition inclination layer is more than 18 nm, the reflectivity R satisfying the minimum value Rmin is not obtained when the number of pairs N is 50 or less. On the other hand, in the case that the film thickness of the composition inclination layer is less than 10 nm, it is difficult to form the composition inclination layer, for example, because it is difficult to perform film forming uniformly (to allow crystal growing) without causing defects.

FIG. 8B shows the temperature rise ΔT in Examples 1 to 3 together with the temperature rise ΔT in Comparative Example 1 (the temperature rise shown in FIG. 6A is shown here again). Although the temperature rise ΔT in Comparative Example 1 is 46° C., the temperature rise ΔT in Example 1 is ΔT=39° C., the temperature rise ΔT in Example 2 is ΔT=38.5° C., and the temperature rise ΔT in Example 3 is ΔT=38° C.; the temperature rise is thus suppressed.

According to the results of the examination described above, it is found that both the decrease in the resistance and the improvement in the heat radiation of the device can be attained without decreasing the reflectivity in the DBR according to the embodiment in comparison with Comparative Example. Furthermore, in the case that the difficulty in production, such as the difficulty in crystal growing, is considered, it is found that the range of the film thickness of the composition inclination layer in which both the decrease in the resistance and the improvement in the heat radiation of the device can be attained without decreasing the reflectivity is approximately 10 nm or more and 18 nm or less.

Next, the outline of the method of producing the surface emitting semiconductor laser device 10 according to the embodiment will be described below.

First, an n-type GaAs buffer layer 14 having a carrier concentration of $2 \times 10^{18}$ cm$^{-3}$ and a film thickness of approximately 500 nm is laminated on an n-type GaAs substrate 12 by a metal organic chemical vapor deposition (MOCVD) method.

Next, an $Al_{0.9}Ga_{0.1}As$ layer serving as a high thermal conductivity layer (low refractive index layer) 160 having a film thickness of 0.25λ/n is formed on the n-type GaAs buffer layer 14. Then, a composition inclination layer 166 in which $Al_{0.9}Ga_{0.1}As$ is gradually changed to $Al_{0.3}Ga_{0.7}As$ by changing the composition of Al and Ga is formed on the high thermal conductivity layer 160. Next, an $Al_{0.3}Ga_{0.7}As$ serving as a low thermal conductivity layer 164 is formed on the composition inclination layer 166, and a composition inclination layer 162 in which $Al_{0.3}Ga_{0.7}As$ is gradually changed to $Al_{0.9}Ga_{0.1}As$ by changing the composition of Al and Ga is formed on the low thermal conductivity layer 164. At the time, the respective layers are formed so that the total of the film thicknesses of the composition inclination layer 166, the low thermal conductivity layer 164 and the composition inclination layer 162 becomes 0.25λ/n. The lamination composed of the high thermal conductivity layer 160, the composition inclination layer 166, the low thermal conductivity layer 164 and the composition inclination layer 162 is repeated by the number of required cycles (the number of pairs N) to perform film forming, thereby forming the lower DBR 16. At the time, the carrier concentration of the $Al_{0.3}Ga_{0.7}As$ layer and the carrier concentration of the $Al_{0.9}Ga_{0.1}As$ are each set to approximately $2 \times 10^{18}$ cm$^{-3}$, and the total film thickness of the lower DBR is set to approximately 4 μm.

Next, an active region 24 composed of a lower spacer layer 18 formed of a non-doped $Al_{0.6}Ga_{0.4}As$ layer, a non-doped quantum well active layer 20 and an upper spacer layer 22 formed of a non-doped $Al_{0.6}Ga_{0.4}As$ layer is formed on the lower DBR 16. The quantum well active layer 20 is composed of four barrier layers formed of $Al_{0.3}Ga_{0.7}As$ and three quantum well layers formed of $Al_{0.11}Ga_{0.89}As$ provided between the respective barrier layers. The film thickness of each quantum well layer formed of $Al_{0.3}Ga_{0.7}As$ is set to approximately 5 nm, the film thickness of each quantum well layer formed of $Al_{0.11}Ga_{0.89}As$ is set to approximately 9 nm, and the film thickness of the whole active region 24 is set to an in-medium wavelength λ/n. In the embodiment, the oscillation wavelength is set to 780 nm by the configuration of the above-mentioned active region 24.

Then, a p-type AlAs layer is formed on the upper spacer layer 22, and an $Al_{0.3}Ga_{0.7}As$ layer and an $Al_{0.9}Ga_{0.1}As$ layer, each having a film thickness of 0.25λ/n, are used as a pair and laminated alternately by the predetermined number of pairs to form a p-type upper DBR 26 on the AlAs layer. At this time, the carrier concentration of the $Al_{0.3}Ga_{0.7}As$ layer and the carrier concentration of the $Al_{0.9}Ga_{0.1}As$ layer are each set to approximately $2 \times 10^{18}$ cm$^{-3}$, and the film thickness of the whole upper DBR 26 is set to approximately 3 μm. A contact layer 28 formed of p-type GaAs and having a carrier concentration of approximately $1 \times 10^{19}$ cm$^{-3}$ and a film thickness of approximately 10 nm is formed on the upper DBR 26.

In this production method, trimethyl gallium, trimethyl aluminum and arsine are used as materials, for example, and disilane is used as an n-type dopant and carbon tetrabromide is used as a p-type dopant, for example. Furthermore, the growing is performed continuously while the temperature of the substrate during growing is set to approximately 700° C. and the materials are changed sequentially under reduced pressure.

In the above-mentioned embodiment, the mode in which the DBR according to the present invention is applied to the lower DBR is taken as an example and described above. However, the embodiment is not limited to this mode, but the DBR may also be applied to the upper DBR or may also be applied to both the lower DBR and the upper DBR.

In the case that an n-type substrate is used as in the embodiment, since the p-type upper DBR is originally high in resistance due to carriers (holes), in the case that a composition inclination layer is introduced, its film thickness is required to be increased (for example, approximately 20 nm). On the other hand, if the film thickness of the composition inclination layer is increased, the reflectivity of the DBR lowers (for example, see FIG. 8A). Hence, it is considered necessary to increase the number of pairs for the DBR to an unrealistic number of pairs to satisfy the minimum value of the reflectivity R. In this case, as in the above-mentioned embodiment, it is preferable that the DBR configuration according to the present invention should be adopted for the lower DBR and that the DBR configuration according to the conventional technology shown in FIG. 3C should be adopted for the upper DBR.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and there equivalents.

What is claimed is:

1. A surface emitting semiconductor laser comprising:
    a substrate; and
    a semiconductor layer including:
        a first semiconductor multilayer film including a plurality of first sets, each set being formed of two layers different from each other in refractive index and thermal conductivity; and a second semiconductor multilayer film the second semiconductor multilayer including a plurality of second sets, each set being formed of two layers different from each other in refractive index and thermal conductivity; and an active layer provided between the first semiconductor multilayer film and the second semiconductor multilayer film, wherein the first semiconductor multilayer film, the second semiconductor multilayer film, and the active layer constitutes a resonator, at least one set in the plurality of first sets and the plurality of second sets is composed of a first layer having a first thermal conductivity, a first composition inclination layer, a second layer having a second thermal conductivity lower than the first thermal conductivity and a second composition inclination layer, and an optical film thickness of the first layer is $(2m+1)\lambda/4$, wherein $\lambda$ is an oscillation wavelength of the resonator and m is an integer, and a total optical film thickness of the first composition inclination layer, the second layer and the second composition inclination layer is $(2n+1)\lambda/4$, wherein $\lambda$ is the oscillation wavelength of the resonator and n is an integer equal to or less than m.

2. The surface emitting semiconductor laser device according to claim 1, wherein the substrate is an N-type into which an N-type impurity is doped, the first semiconductor multilayer film is an N-type into which an N-type impurity is doped, at least one set in the plurality of the first sets is composed of a first layer having the first thermal conductivity, a first composition inclination layer, a second layer having the second thermal conductivity and a second composition inclination layer, an optical film thickness of the first layer is $(2m+1)\lambda/4$, wherein $\lambda$ is an oscillation wavelength of the resonator and m is an integer, and a total optical film thickness of the first composition inclination layer, the second layer and the second composition inclination layer is $(2n+1)\lambda/4$, wherein $\lambda$ is the oscillation wavelength of the resonator and n is an integer equal to or less than m, and the second semiconductor multilayer film is a P-type into which a P-type impurity is doped, and at least one set in the plurality of the second sets is composed of a third layer having a third thermal conductivity, a third composition inclination layer, a fourth layer having a fourth thermal conductivity lower than the third thermal conductivity and a fourth composition inclination layer, and a total optical film thickness of the third layer, the third composition inclination layer, the fourth layer and the fourth composition inclination layer is an integer multiple of $\lambda/2$, wherein $\lambda$ is an oscillation wavelength of the resonator.

3. The surface emitting semiconductor laser device according to claim 1, wherein antinodes and nodes of light intensity distribution in an inside of at least one of the first semiconductor multilayer film and the second semiconductor multilayer film are positioned at an interface between the first layer and the first composition inclination layer or at an interface between the first layer and the second composition inclination layer, but the antinodes and the nodes are not positioned either at an interface between the second layer and the first composition inclination layer and or at an interface between the second layer and the second composition inclination layer.

4. The surface emitting semiconductor laser device according to claim 2, wherein antinodes and nodes of light intensity distribution in an inside of at least one of the first semiconductor multilayer film and the second semiconductor multilayer film are positioned at an interface between the first layer and the first composition inclination layer or at an interface between the first layer and the second composition inclination layer, but the antinodes and the nodes are not positioned either at an interface between the second layer and the first composition inclination layer and or at an interface between the second layer and the second composition inclination layer.

5. The surface emitting semiconductor laser device according to claim 1, wherein each of an optical film thickness of the first composition inclination layer and an optical film thickness of the second composition inclination layer is 10 nm to 18 nm.

6. The surface emitting semiconductor laser device according to claim 2, wherein each of an optical film thickness of the first composition inclination layer and an optical film thickness of the second composition inclination layer is 10 nm to 18 nm.

7. The surface emitting semiconductor laser device according to claim 3, wherein each of an optical film thickness of the first composition inclination layer and an optical film thickness of the second composition inclination layer is 10 nm to 18 nm.

8. The surface emitting semiconductor laser device according to claim 4, wherein each of an optical film thickness of the first composition inclination layer and an optical film thickness of the second composition inclination layer is 10 nm to 18 nm.

* * * * *